United States Patent [19]

Albiniak

[11] Patent Number: 5,208,543
[45] Date of Patent: May 4, 1993

[54] POWER ANTENNA QUICK TESTER WITH OPTICAL REMOTE INDICATOR

[76] Inventor: Donald W. Albiniak, 930 Hiawatha Dr., Elgin, Ill. 60120

[21] Appl. No.: 703,675

[22] Filed: May 21, 1991

[51] Int. Cl.⁵ .................. G01R 31/02; G02B 3/36
[52] U.S. Cl. .................. 324/556; 324/503; 324/511; 324/542; 324/133; 385/49
[58] Field of Search .......... 324/503, 505, 511, 537, 324/539, 542, 556, 133; 340/438, 635, 651, 654; 439/490; 455/271, 281, 283; 343/703; 385/15, 31, 32, 49

[56] References Cited

U.S. PATENT DOCUMENTS

| | | | |
|---|---|---|---|
| 3,699,433 | 10/1972 | Smith, Jr. | 324/556 X |
| 4,095,172 | 6/1978 | Strand | 324/503 |
| 4,155,036 | 5/1979 | Nicholson | 324/511 |
| 4,969,702 | 11/1990 | Anderson | 385/49 X |

FOREIGN PATENT DOCUMENTS 0245723  11/1986  Japan .................. 324/556

Primary Examiner—Gerard R. Strecker
Assistant Examiner—Diep Do
Attorney, Agent, or Firm—Leon Gilden

[57] ABSTRACT

A tester for power operated vehicle antennas is designed to be inserted serially within the power antenna's operating circuit and utilizes light emitting diodes to indicate proper circuit operation. A flexibly positionable fiber optic cable can also be utilized to permit the viewing of illuminated diodes from a remote location.

2 Claims, 6 Drawing Sheets

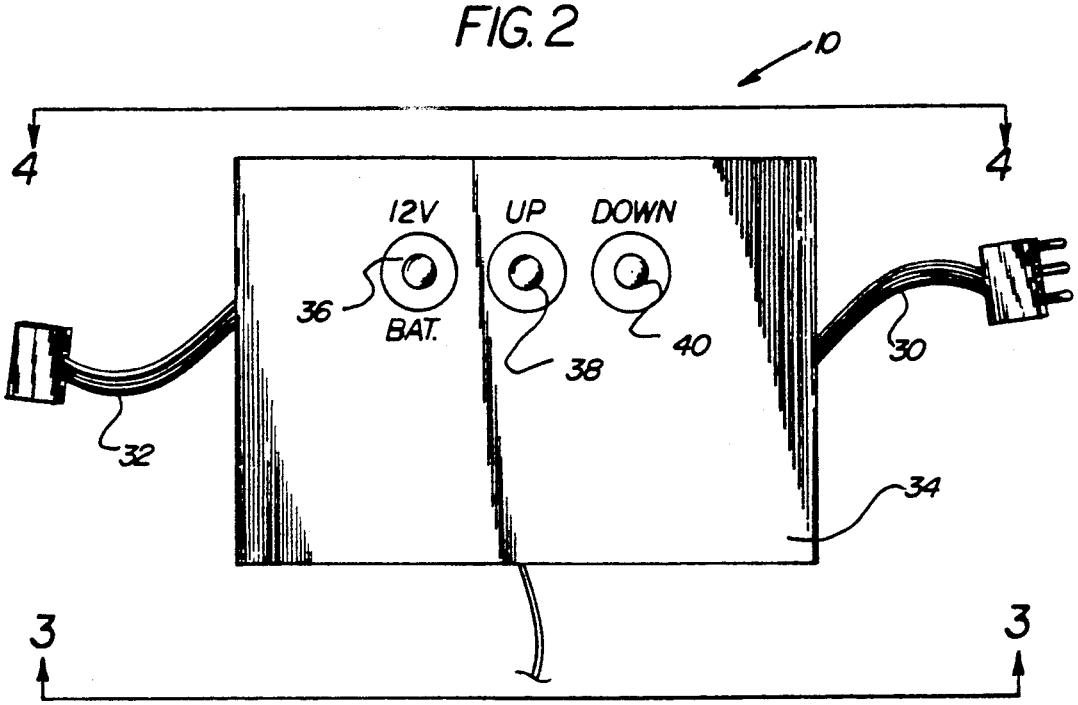
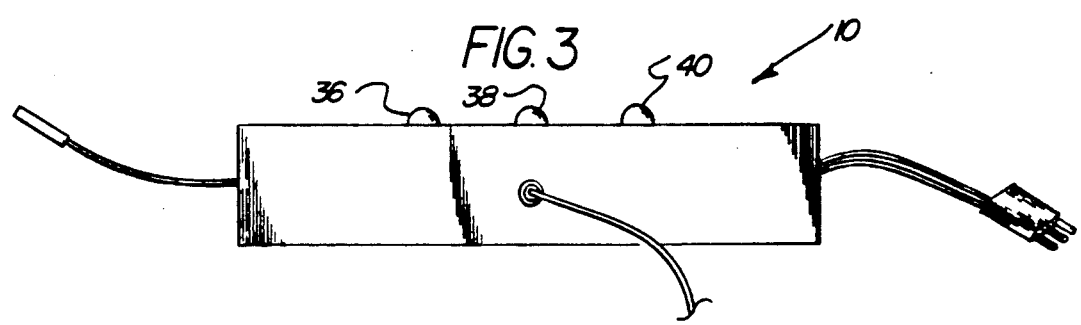
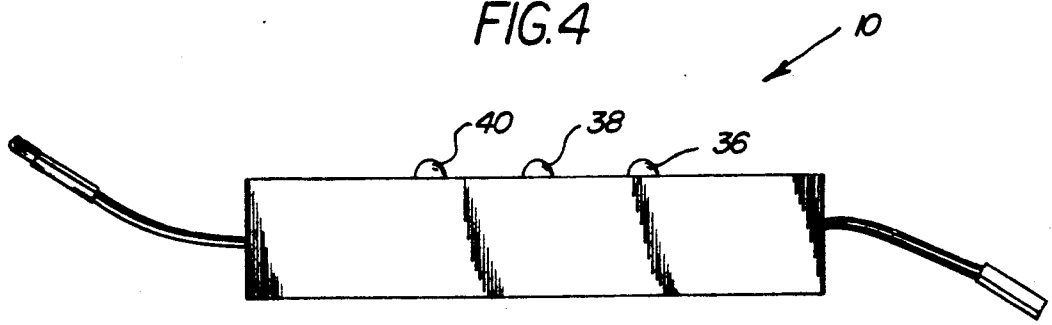

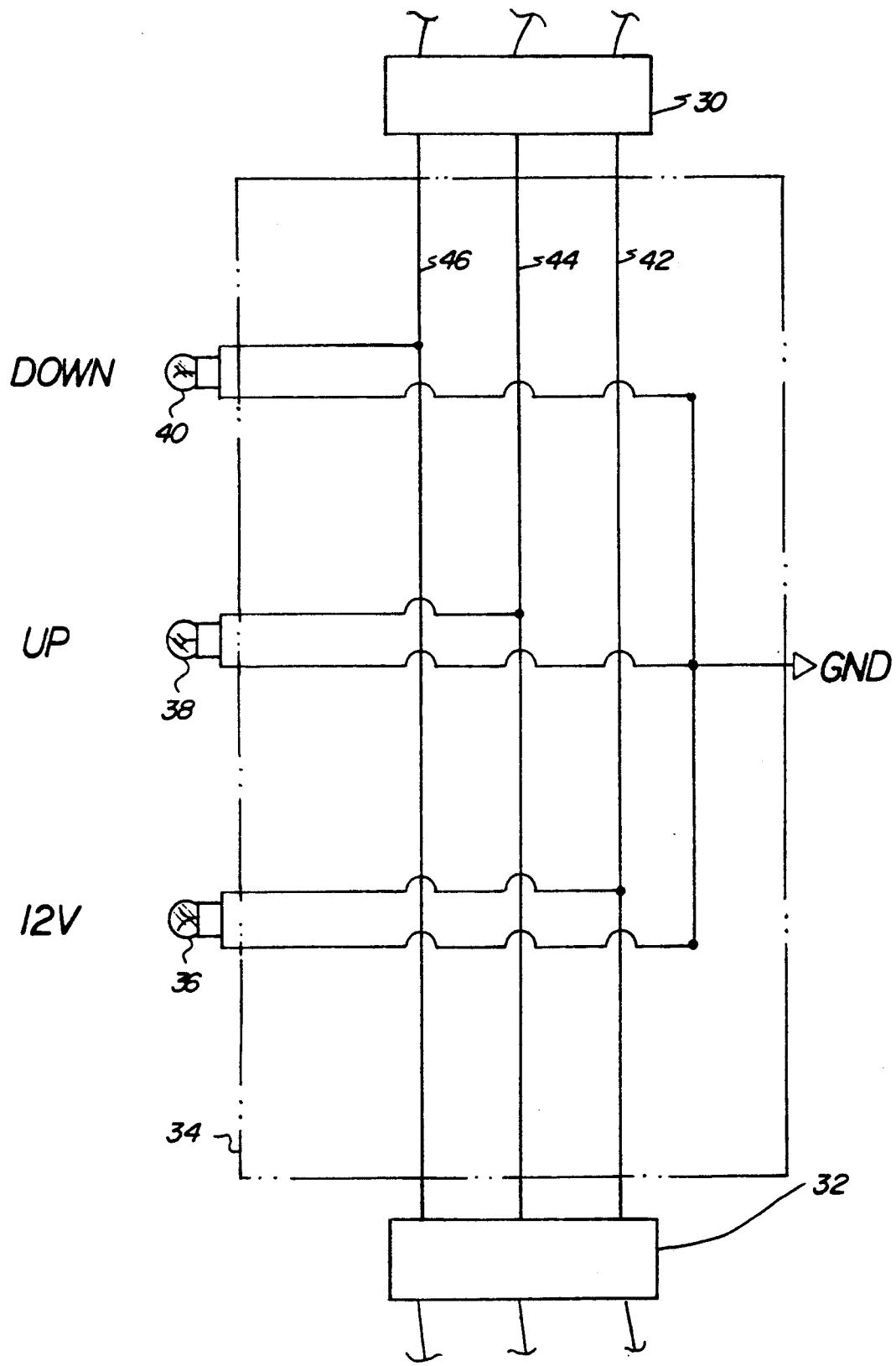

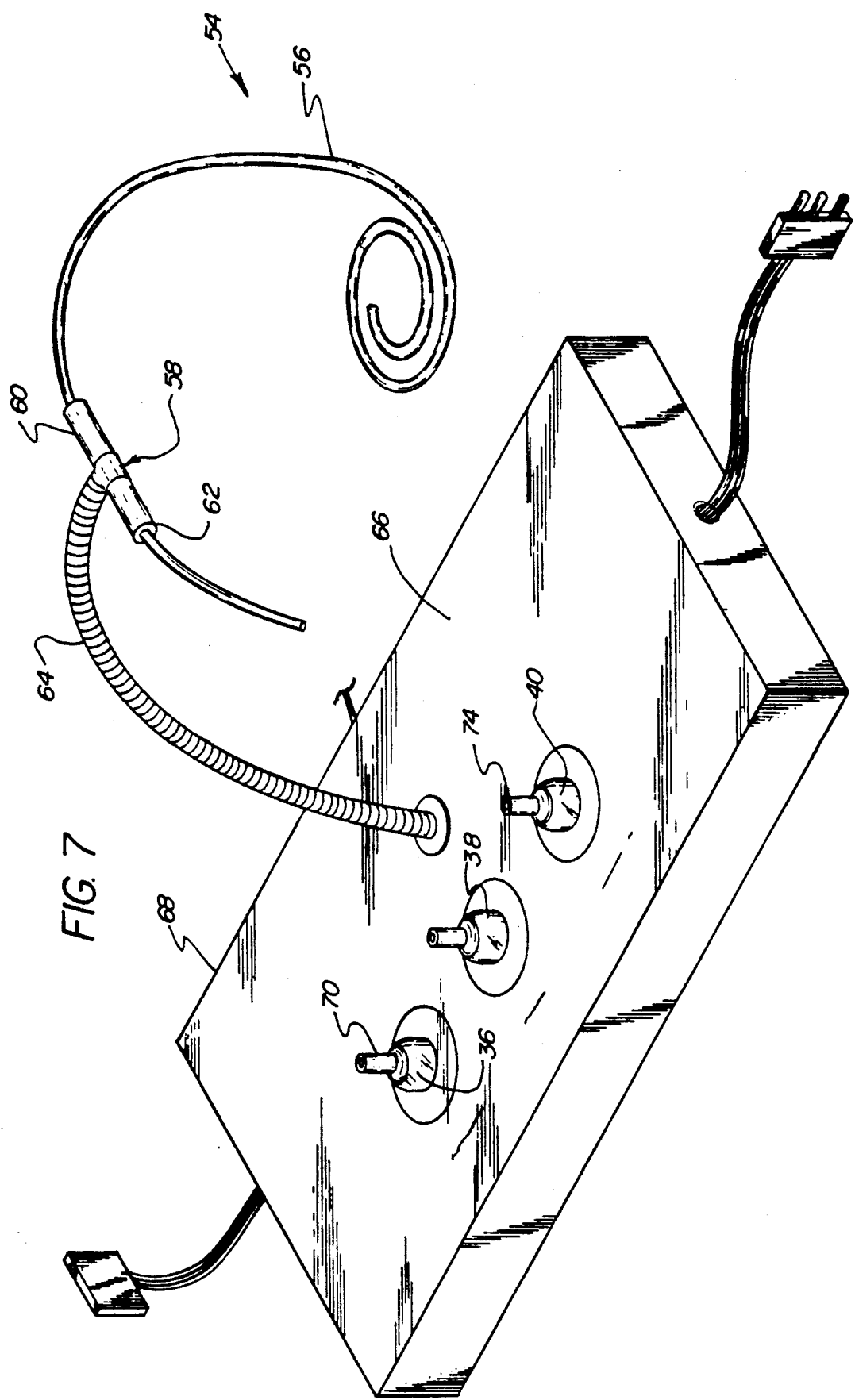

POWER ANTENNA QUICK TESTER WITH OPTICAL REMOTE INDICATOR

BACKGROUND OF THE INVENTION

1. Field of the Invention

The present invention relates to circuit testing devices and more particularly pertains to a tester operable to confirm the proper functioning of vehicle antennas which are power operated.

2. Description of the Prior Art

The use of circuit testers for power operated vehicle antennas is known in the prior art. For example, U.S. Pat. No. 4,095,172, which issued to William Strand on Jun. 13, 1978, discloses a vehicle antenna tester that is particularly useful in testing antenna wire assemblies before and after installation in a vehicle. The tester utilizes a plurality of selectively operable lamps which can be utilized to indicate faulty grounding of a shielding conductor, breaks in continuity in a feed wire and antenna proper, and leakage passing between the antenna and an isolated conductor either to chassis ground or the shielding conductor.

Another prior art patent of interest is U.S Pat. No. 2,476,509, which issued to Lovell Bryant et al on Jun. 30, 1981. The Bryant et al patent is direct to a probe for testing the conductor of an antenna windshield. The continuity of antenna wires is tested by connecting the wires to a signal generator and when the probe moves over a break in a wire, no signal is picked up by the probe which then provides for an indication of such loss of signal.

While both of these prior art devices are functional for their intended purposes, both are rather complex in construction so as to make them potentially deficient from a commercial marketing standpoint and further, neither of these prior art devices provide for an easy and reliable means of remotely receiving tester information when the use thereof is possibly necessitated beneath the dashboard of a vehicle.

Therefore, it can be appreciated that there exists a continuing need for new and improved vehicle antenna testers which can be cheaply manufactured and reliably used, especially in situations where a user must receive tester information from a remote and inconvenient location. In this regard, the present invention substantially fulfills this need.

SUMMARY OF THE INVENTION

In view of the foregoing disadvantages inherent in the known types of vehicle antenna testers now present in the prior art, the present invention provides an improved power antenna tester construction wherein the same can be utilized to test a power antenna circuit while the user thereof is positioned in a remote and possibly inconvenient location. As such, the general purpose of the present invention, which will be described subsequently in greater detail, is to provide a new and improved power antenna tester which has all the advantages of the prior art power antenna testers and none of the disadvantages.

To attain this, the present invention comprises a tester for power operated vehicle antennas which is designed to be inserted serially within the power antenna's operating circuit and utilizes light emitting diodes to indicate proper circuit operation. A flexibly positionable fiber optic cable is also utilized to permit the viewing of illuminated diodes from a remote location.

There has thus been outlined, rather broadly, the more important features of the invention in order that the detailed description thereof that follows may be better understood, and in order that the present contribution to the art may be better appreciated. There are, of course, additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out it various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

It is therefore an object of the present invention to provide a new and improved power antenna tester which has all the advantages of the prior art power antenna testers and none of the disadvantages.

It is another object of the present invention to provide a new and improved power antenna tester which may be easily and efficiently manufactured and marketed.

It is a further object of the present invention to provide a new and improved power antenna tester which is of a durable and reliable construction.

An even further object of the present invention is to provide a new and improved power antenna tester which is susceptible of a low cost of manufacture with regard to both materials and labor, and which accordingly is then susceptible of low prices of sale to the consuming public, thereby making such power antenna testers economically available to the buying public.

Still yet another object of the present invention is to provide a new and improved power antenna tester which provides in the apparatuses and methods of the prior art some of the advantages thereof, while simultaneously overcoming some of the disadvantages normally associated therewith.

Still another object of the present invention is to provide a new and improved power antenna tester which makes a provision for a use thereof by a user while such user is positioned in a remote and inconvenient location.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein:

FIG. 2 is a top plan view of the invention.

FIG. 3 is a front elevation view of the invention as viewed along the line 3—3 in FIG. 2.

FIG. 4 is a rear elevation view of the invention as viewed along the line 4—4 in FIG. 2.

FIG. 5 is an electrical circuit schematic associated with the operation of the invention.

FIG. 7 is a perspective view of a second embodiment of the invention.

DESCRIPTION OF THE PREFERRED EMBODIMENTS

Figure 1:
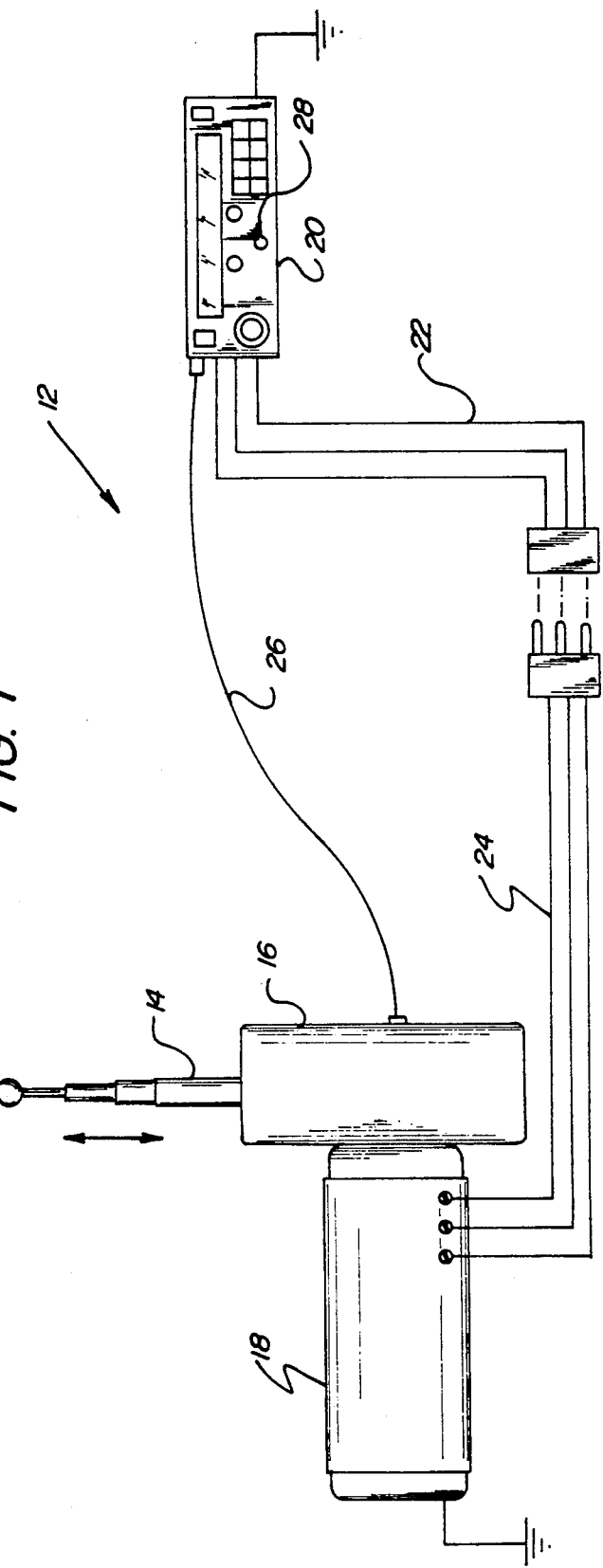
FIG. 1 is a schematic representation of a conventional power antenna operating arrangement in a vehicle.

With reference now to the drawings, and in particular to FIG. 1 thereof, two embodiments of a new and improved power antenna tester embodying the principles and concepts of the present invention and generally designated by the reference numeral 10 will be described.

Initially, reference is made to FIG. 1 of the drawings wherein a conventional power antenna assembly 12 is illustrated. Such a conventional assembly typically includes a telescopingly moveable antenna 14 which is moved into its retracted and extended positions by a conventional gear driven or screw operated drive unit 16. The antenna drive unit 16 is operated by a DC powered motor 18. A conventional car stereo 20 has an electrical harness 22 attached thereto in a known manner with this harness being connectable to a second harness arrangement 24 attached to the motor 18. An antenna cable 26 also extends between the antenna 14 and the stereo 20. The harnesses 22, 24 typically include three wires—one of which supplies a continuous 12 volt DC current to the motor 18, a second of which operates to selectively supply power to extend the antenna 14, and a third of which operates to supply the necessary power to retract the antenna. A spring-biased toggle switch 28 can be moved into two separate positions as desired to supply operating current to either the extension or retraction drives associated with the drive unit 16, thereby to control the telescoping movement of the antenna 14. As can be appreciated, the complete assembly 12 as described in FIG. 1 is of a conventional and well known construction and constitutes no part of the present invention. Rather the present invention is directed to an apparatus and method for testing the delivery of operating power through the harnesses 22, 24 when they are operably connected together.

FIGS. 2, 3 and 4 illustrate a first embodiment of the present invention as designated by the aforementioned reference numeral 10. As shown, the tester 10 includes a first harness 30 which is designed to be connected to the harness 22 as shown in FIG. 1, and a second harness 32 which is electrically connectable to the harness 24 also illustrated in FIG. 1. The harness assemblies 30, 32 extend outwardly from a housing 34 which houses the electrical circuit associated with the present invention, and three selectively illuminable light emitting diodes 36, 38, 40 serve as signal means indicative of proper circuit functioning. In this connection, the diode 36 operates to indicate the delivery of a continuous supply of 12 volt DC power from the battery to the antenna drive unit 16. Diode 38 is illuminated when an operator attempts to telescopingly extend the antenna 14, and diode 40 is illuminated when the operator attempts to retract the antenna.

FIG. 5 of the drawings illustrates a preferred embodiment of the electrical circuit operable to perform the desired testing function of the invention. As illustrated, the hot wire 42 normally receives a continuous supply of DC current which then operates to continuously illuminate the diode 36 in a now apparent manner. When the spring-biased toggle switch 28 is operated to close the antenna extension circuit, a supply of electricity is delivered through the wire 44 which then operates to illuminate the diode 38. Similarly, when the toggle switch 28 is moved in an opposite direction so as to close the antenna retraction circuit, a supply of electrical energy is directed through the wire 46 so as to illuminate the diode 40.

Figure 6:
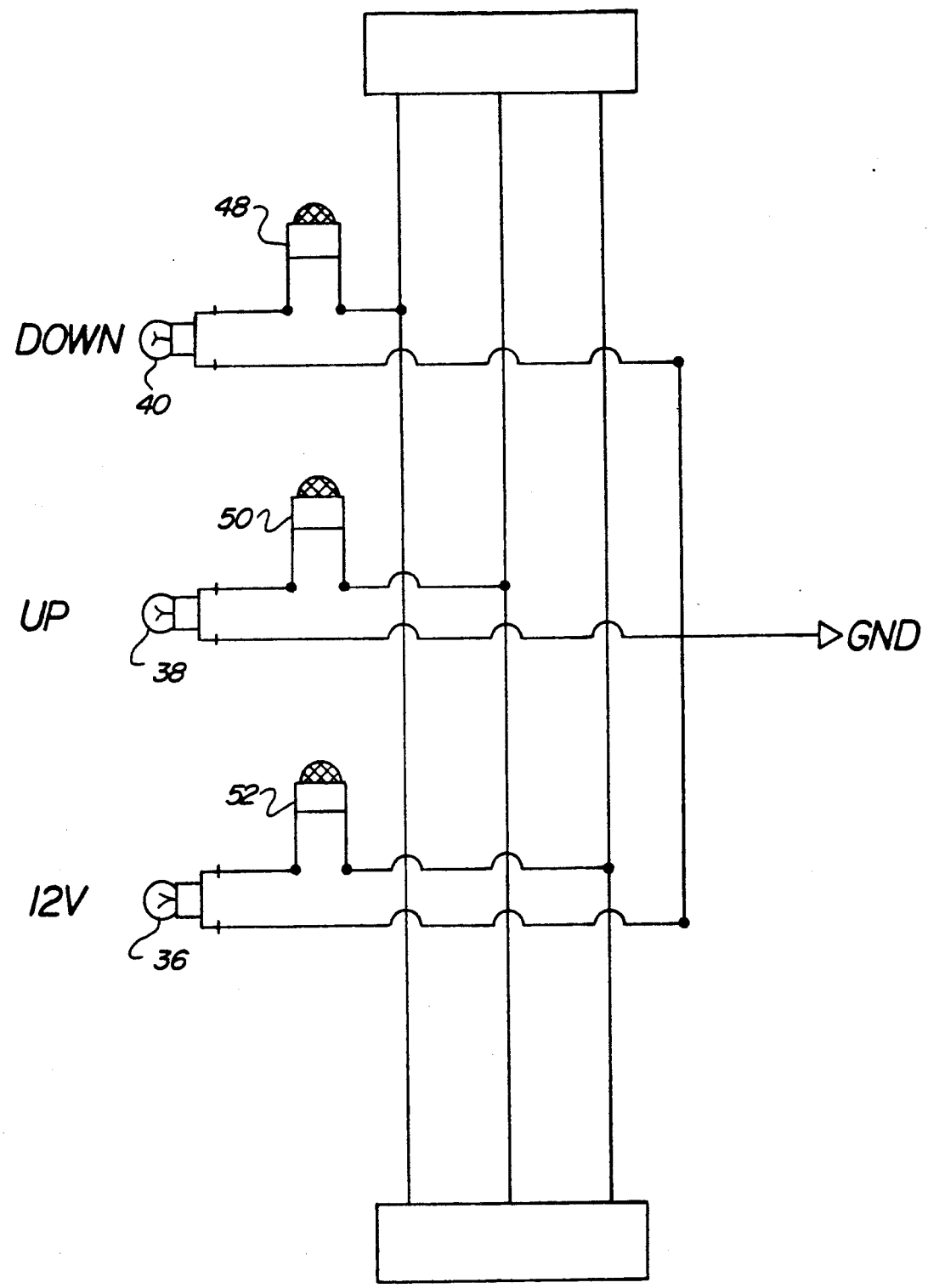
FIG. 6 is an electrical circuit schematic of a modified operating system for in the invention.

FIG. 6 of the drawings essentially illustrates the same circuit as shown in FIG. 5; however, a plurality of small audio signal generators 48, 50, 52 are illustrated as having been inserted within the power circuit. The audio signal generator 52, which by way of example might be a buzzer, is activated at those times that the diode 36 is illuminated since they are serially positioned within the same circuit. Similarly, the signal generators 48, 50 will be activated to emit signalling sounds whenever illumining power is delivered to the respective diodes 40, 38. In the preferred configuration, it is anticipated that the three signal generators 48, 50, 5 will all have their own distinctively different audio sounds, whereby a distinction can be ascertained by a listener as to which generators are operational.

FIG. 7 of the drawings illustrates a second embodiment of the tester comprising the present invention wherein such second embodiment is generally designated by the reference numeral 54. The second embodiment of the invention is essentially the same as the embodiment shown in FIG. 2 of the drawings with the exception of certain additional attachments being added thereto. More specifically, the second embodiment 54 further includes a remotely positionable and viewable signalling device in the form of an extended length of fiber optic cable 56 fixedly secured within a cushioned tube 58. The tube 58 includes a rigid outer shell 60 and a tubular section of compressed foam rubber 62 retained therein. The fiber optic cable 56 is compressably positioned through the foam rubber member 62 so as to be frictionally retained in place while being selectively slidably moveable therethrough when required. Tubular holder 58 is fixedly secured to a bendable wire member 64 which in turn is fixedly secured by some conventional means to a top surface 66 of the housings 68.

Figure 9:
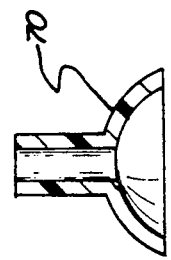
FIG. 9 is a cross-sectional view of the connector as viewed along the line 9—9 in FIG. 8.
Figure 8:
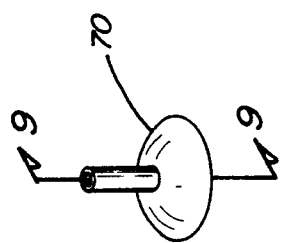
FIG. 8 is a perspective view of a bulb-to-cable connector forming a part of the present invention.

As shown in FIGS. 7, 8 and 9, a cap-like connector 70 is designed to be fixedly secured to the top of each of the diodes 36, 38, 40. The cap connector 70 can be attached to the diodes 36, 38, 40 by any conventional means, such as through the use of an adhesive or the like, and each connector is designed to permit an optical coupling of the fiber optic cable 56 to a selected one of the diodes.

Figure 10:
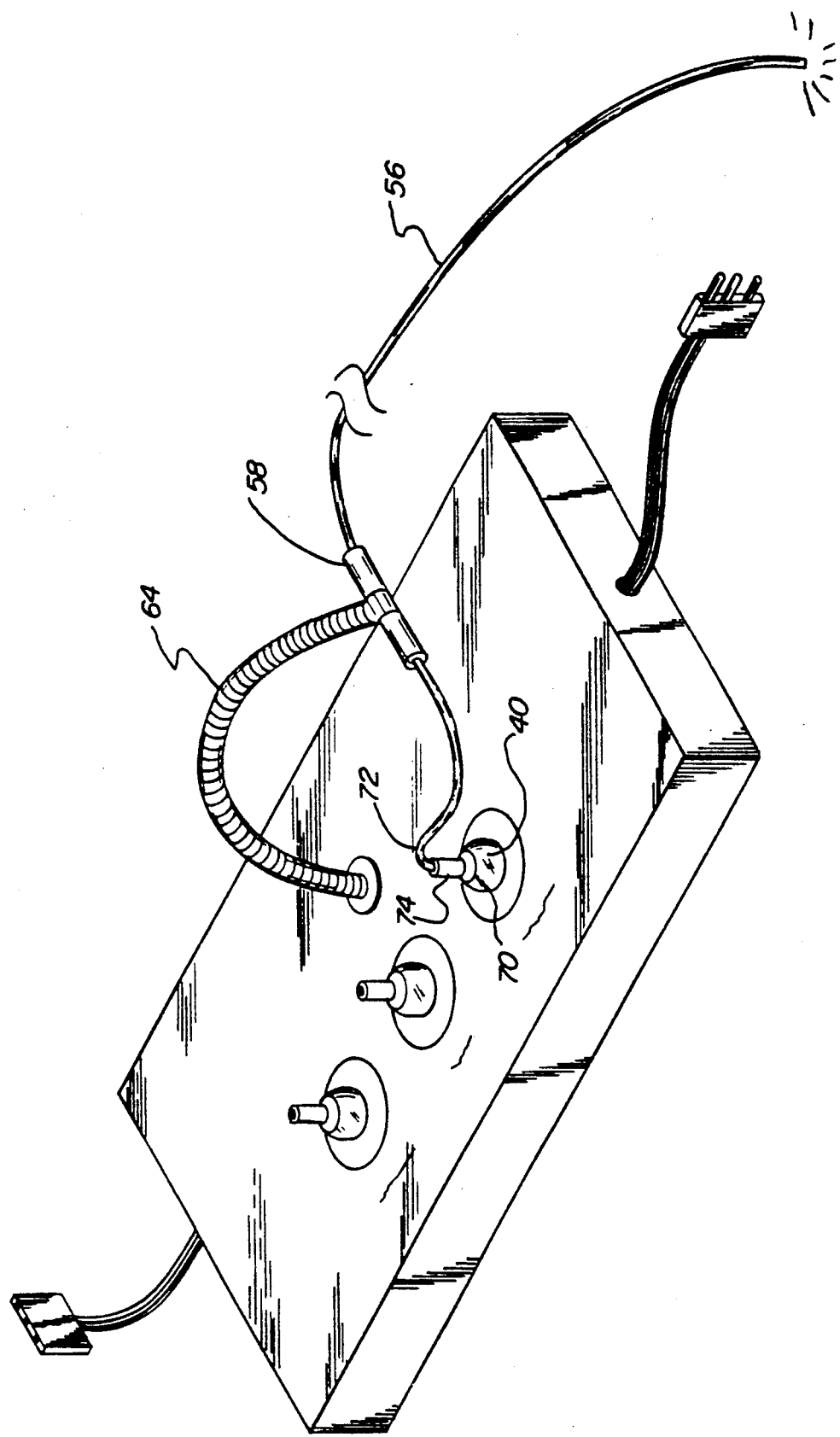
FIG. 10 is a perspective view of the second embodiment of the invention illustrating a use thereof.

FIG. 10 of the drawings illustrates a typical use of the second embodiment 54 of the invention wherein the fiber optic cable 56 has had a first free end 72 thereof slidably positioned within the tubular top portion 74 of a typical cap connector 70 with this positioning of the cable being made possible both by the slidable movement of the fiber optic cable 56 through the tubular holder 58 and also by the bending of the wire member 64. When electrical power is delivered to the light emitting diode 40, an illumination thereof results with such illumination also then being directed through the fiber optic cable 56. A user of the invention who at the moment might be positioned under the dashboard of a vehicle will note that the fiber optic cable 56 is illuminated if such cable is allowed to dangle in an area encompassed by his vision. As such, the useability of the present invention is greatly enhanced through this additional signal generating and delivery function.

As to the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as being new and desired to be protected by Letters Patent of the United States is as follows:

1. A power antenna tester comprising:

housing means;

circuit means retained within said housing means, said circuit means being serially connectable to electrical power supply leads which function to operate said power antenna; and signal means attached to said housing means and being operable to indicate a desired delivery of electrical power though said electrical power supply leads, wherein said electrical power supply leads include a first supply lead which operates to deliver a continuous supply of DC current to said power antenna, a second supply lead which operates to selectively deliver DC current to an extension mechanism associated with said power antenna, and a third supply lead which operates to deliver DC current to a retraction mechanism associated with said power antenna, wherein said signal means comprises first, second and third light emitting diodes, said first, second and third diodes being illuminable when DC current is respectively delivered through said first, second and third supply leads, said power antenna tester further including remote signal indicating means, said remote signal means including a length of fiber optic cable, said cable being selectively attached to at least one of said light emitting diodes, wherein a connection of said fiber optic cable to at least one of said light emitting diodes is accomplished through a use of a bulb connector assembly, said bulb connector assembly comprising a conically shaped connector attachable to one of said light emitting diodes, wherein said power antenna tester further includes a holder assembly attached to said housing means, said holder assembly being selectively positionable into a plurality of chosen configurations and being operable to hold said fiber optic cable in a desired viewable position, and wherein said holder assembly further includes a tubular member through which one end of said fiber optic cable may be selectively positioned and frictionally engaged to effect an attachment thereof to said holder assembly.

2. The new and improved power antenna tester as described in claim 1, and further including audio signal means associated with said signal means.

* * * * *